United States Patent [19]

White et al.

[11] 4,243,960
[45] Jan. 6, 1981

[54] METHOD AND MATERIALS FOR TUNING THE CENTER FREQUENCY OF NARROW-BAND SURFACE-ACOUSTIC-WAVE (SAW) DEVICES BY MEANS OF DIELECTRIC OVERLAYS

[75] Inventors: David J. White; Carl N. Helmick, Jr.; Robert E. Hunt, all of Ridgecrest, Calif.

[73] Assignee: The United States of America as represented by the Secretary of the Navy, Washington, D.C.

[21] Appl. No.: 933,395

[22] Filed: Aug. 14, 1978

[51] Int. Cl.³ .................. H03H 9/64; H03H 9/42; H03H 9/25; H01L 41/22
[52] U.S. Cl. .................. 333/196; 29/25.35; 310/313 R; 333/154
[58] Field of Search .................. 333/193–196, 333/150–155; 310/313; 331/107 A; 328/14; 29/25.35

[56] References Cited

U.S. PATENT DOCUMENTS

| 3,401,276 | 9/1968 | Curran et al. ............... 333/191 X |
| 3,549,414 | 12/1970 | Curran et al. ............... 333/191 X |
| 3,558,213 | 1/1971 | Marcatili ..................... 333/116 X |
| 3,626,309 | 12/1971 | Knowles ....................... 333/151 |
| 3,627,569 | 12/1971 | Beecham . |
| 3,775,277 | 11/1973 | Pompei et al. ............... 324/61 R |
| 3,864,161 | 2/1975 | Thompson ................... 333/191 X |
| 3,891,929 | 6/1975 | Carr et al. ................... 328/14 |
| 3,992,079 | 11/1976 | Giallorenzi .................. 350/96.13 |
| 4,038,615 | 7/1977 | Ishiyama et al. ............. 333/193 |

OTHER PUBLICATIONS

Helmick, Jr. et al., "Fine Tuning of Narrow-Band SAW Devices Using Dielectric Overlays", 1977 Ultrasonics Symposium Proceedings, IEEE Cat., #77CH1264-ISU; pp. 659-663.
Sander et al., "Impact of Charge Coupled Devices and Surface Acoustic Waves on Signal Processing and Imagery in Advanced Systems," Paper No. 3–10 to 34th Technical Meeting of Agard/AVP, Ottawa, Canada, Oct. 1977, pp. 1–21.

Primary Examiner—Marvin L. Nussbaum
Attorney, Agent, or Firm—R. S. Sciascia; W. Thom Skeer; Donald R. Mollick

[57] ABSTRACT

A method and device for adjusting the center frequency after fabrication of surface acoustic wave (SAW) devices by the deposition of a nonconducting coating which alters the SAW propagation velocity of the device.

8 Claims, 3 Drawing Figures

METHOD AND MATERIALS FOR TUNING THE CENTER FREQUENCY OF NARROW-BAND SURFACE-ACOUSTIC-WAVE (SAW) DEVICES BY MEANS OF DIELECTRIC OVERLAYS

BACKGROUND OF THE INVENTION

Field of the Invention

The present invention relates to surface acoustic wave (SAW) devices and more particularly to a means for adjusting center frequency by deposition of a nonconducting film.

Surface acoustic waves-also known as acoustic waves, surface elastic waves or elastic surface waves- are elastic waves which propagate along a material surface or interface and whose amplitude decreases with the normal distance from said surface or interface. The best-known form of surface wave is termed the "Rayleigh wave", but there exist other modes of elastic wave propagation which can be included in the category of surface acoustic waves. A SAW device, then, is any device making use of surface acoustic waves.

SAW devices generally consist of a number of metal interdigitated electrodes deposited on a piezoelectric substrate, though other configurations are sometimes used. SAW devices are used in the generation and analog processing of electronic signals in the range of $10^7$–$10^9$ Hz. A problem that has arisen is that users often specify the center frequency of the passband of narrow-band SAW devices to within 100 ppm or less, while with the present technology accuracy better than 0.5% is difficult and expensive to obtain. Some tuning of SAW devices is possible by means of adjusting the other electronic circuit components values (such as inductance, resistance, capacitance), but such external tuning is ordinarily usable over only a very limited range. This problem has led to efforts to adjust the center frequency of SAW devices after fabrication. One means of adjusting the center frequency is by reducing the thickness of the metal electrodes by chemical etching. Etching allows adjustment in only one direction by a very small amount and is difficult to monitor precisely. Alternatively, the frequency can be adjusted by the use of a laser trimmer to burn off electrode fingers or portions of electrode fingers. This method requires ulta-precise and expensive laser equipment and necessitates the use of special electrode designs to obtain both upward and downward adjustment capability.

SUMMARY OF THE INVENTION

This invention adjusts the center frequency of surface-acoustic-wave (SAW) devices by deposition of a film of electrically nonconducting material which alters the propagation velocity of surface acoustic waves on the substrate.

Upward or downward adjustment of center frequency can be accomplished by appropriate choice of film material. The center frequency may be monitored during the deposition in order to control the amount of frequency adjustment.

DESCRIPTION OF THE PREFERRED EMBODIMENT

Figure 1:
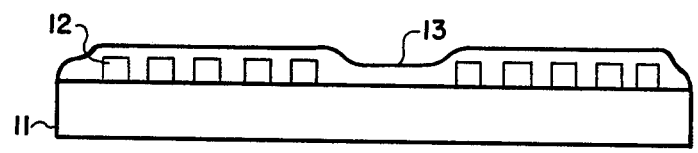
FIG. 1 is a cross-sectional view of a typical SAW device with a nonconducting coating.

Referring to FIG. 1, there is shown a cross-sectional view of a SAW device. As shown, the deivce includes a substrate 11 made of a piezoelectric material such as quartz. One or more transducing electrode structures 12 are formed on the surface of the substrate, usually by photolithographic techniques. Commonly there are two such electrode structures 12, one near each end of the substrate; these serve as the input and output transducers. In practical configurations each transducer consists of two sets of interdigital metallic fingers, each set connected to a common connector.

In this embodiment a nonconducting film 13 is deposited on the substrate and electrodes to be in contact therewith, as shown. In experimental devices the film was deposited on quartz delay lines by electron-beam evaporation for all coating materials except cadmium sulfide (CdS). To deposit cadmium sulfide (CdS) a resistively heated boat was employed. Coating thicknesses ranged from 1250 Å to 6200 Å. Film materials used were $MgF_2$, $SiO_2$, ZnS, CdS and $Al_2O_3$. All of the materials tested produced negligible or downward shift in frequency with the exception of $Al_2O_3$ (aluminum oxide), which produced an upward shift. During the deposition, the film thickness was monitored and the deposition was stopped when the desired thickness was obtained. In one case the center frequency was monitored continuously while the coating was being deposited. The SAW device was set up as an oscillator, and the frequency of oscillation was recorded once or twice a minute during the 17-minute deposition. Conventional methods of deposition and frequency determination were used throughout the tests.

| SAW DEVICE | OVERLAY FILM | | SUBSTRATE | | | UNCOATED DEVICE | | COATED DEVICE | |
|---|---|---|---|---|---|---|---|---|---|
| | Material | Thickness h (μm) | Cut-Orient. | Material | I.D. # | Frequency $f_o$(MHz)[4] | Loss L (dB) | Freq. Shift $\Delta f$ (MHz)[4] | Loss Change $\Delta L$ (dB) |
| SIMPLE DELAY LINE | ZnS | 0.125 | Y-X | Quartz | 1 | 62.31 | 8.5 | −0.06 | 0.3 |
| | | .340 | " | Quartz | 3 | 62.31 | 8.5 | −0.25 | 1.1 |
| | | .560 | " | Quartz | 4 | 62.315 | 8.0 | −0.532 | 5.5 |
| | | .590[1] | " | Quartz[2] | 17 | 62.43 | 11.0 | −0.47 | 1.5 |
| | | .132 | " | Quartz | A2 | 124.67 | 11.0 | −0.61 | 0.4 |
| | | .350[1] | ST-X | Quartz | 10 | 62.296 | 10.5 | −0.312 | 1.0 |
| | | .360 | " | Quartz[7] | 16 | 62.276 | 11.0 | −0.273 | 0.5 |
| | | .350[1] | HC-X | Quartz | 8 | 63.350 | 9.5 | −0.348 | 0.7 |
| | $Al_2O_3$ | .320 | Y-X | Quartz | 12 | 62.312 | 8.7 | +0.178 | 2.0 |
| | | .620 | " | Quartz[3] | 14 | 62.313 | 9.3 | +0.458 | 2.6 |
| | | .160 | " | Quartz | A1 | 124.663 | 10.5 | +0.751 | 0.8 |
| | CdS | .211 | Y-X | Quartz | 13 | 62.314 | 9.2 | −0.49 | 33. |
| | $MgF_2$ | .200 | Y-X | Quartz[2] | — | 62.32 | 10. | ≈0[5] | 12. |
| | $SiO_2$ | .260 | Y-X | Quartz[2] | — | 62.26 | 9.5 | −0.07 | 0.9 |

-continued

| SAW DEVICE | OVERLAY FILM Material | Thickness h (μm) | SUBSTRATE Cut-Orient. | Material | I.D. # | UNCOATED DEVICE Frequency $f_o$(MHz)[4] | Loss L (dB) | COATED DEVICE Freq. Shift Δf (MHz)[4] | Loss Change ΔL (dB) |
|---|---|---|---|---|---|---|---|---|---|
|  |  | .430[1] | " | Quartz[6] |  | " | " | −0.07 | 13.5 |
| DISCRIMINATOR | ZnS | .43 | HC-X | Quartz | — | 60.25 | 15[8] | −0.26 | 33[9] |

NOTES:
[1] Total thickness of two successive evaporation runs (vacuum broken between runs).
[2] Specimens coated and measured in an earlier pilot study (1975) using somewhat different methods.
[3] Natural quartz substrate (all others synthetic).
[4] Frequency measurements performed at ambient temperature of 25 ± . 5° C.
[5] No frequency shift observed for $MgF_2$ on Y-X quartz, only increased insertion loss.
[6] Second (successive) evaporation on preceding specimen produced only more loss, no further Δf.
[7] Frequency of oscillation during deposition.
[8] Change (enhancement) of notch depth after ZnS coating.

The above table shows the results of tests on a number of nonconducting film materials on the SAW devices. Zinc sulfide (ZnS), which has a SAW propagation velocity lower than that of quartz, is the most promising film material for producing downward shifts in frequency. It is apparant that the method is successful with natural and synthetic quartz substrates. The method also is applicable to the different cuts orientations used. It will be noted that the amount of frequency change increases as the thickness of the coating is increased. With ZnS the amount of loss remains acceptable even with the thickest coatings used. The invention can be used on delay lines and discriminators as well as other SAW devices.

Aluminum oxide ($Al_2O_3$), which has a SAW velocity greater than that of quartz, produces an upward shift in center frequency. The table shows the effect of three different thicknesses of $Al_2O_3$. The increase in loss remains acceptable in these devices. Thus, both upward and downward shifts in center frequency are obtainable without undue increase in the amount of loss.

Cadmium sulfide (CdS), which has a SAW velocity markedly lower than that of quartz, produces the largest downward frequency shift of any material tested. For most purposes the increase in insertion loss is unacceptable. The high loss is due to the appreciable electric conductivity of the film as deposited. A different deposition procedure may be capable of yielding a CdS film of sufficiently low conductivity to result in a useful device.

Silicon dioxide ($SiO_2$) was also tested, but it produced only very small downward shifts in frequency.

In summary it is apparant that each new film material under consideration must be separately tested and a selection made from the tested materials to find a film-/substrate pair suitable for a particular purpose. The art is thus highly emperical.

Figure 2:
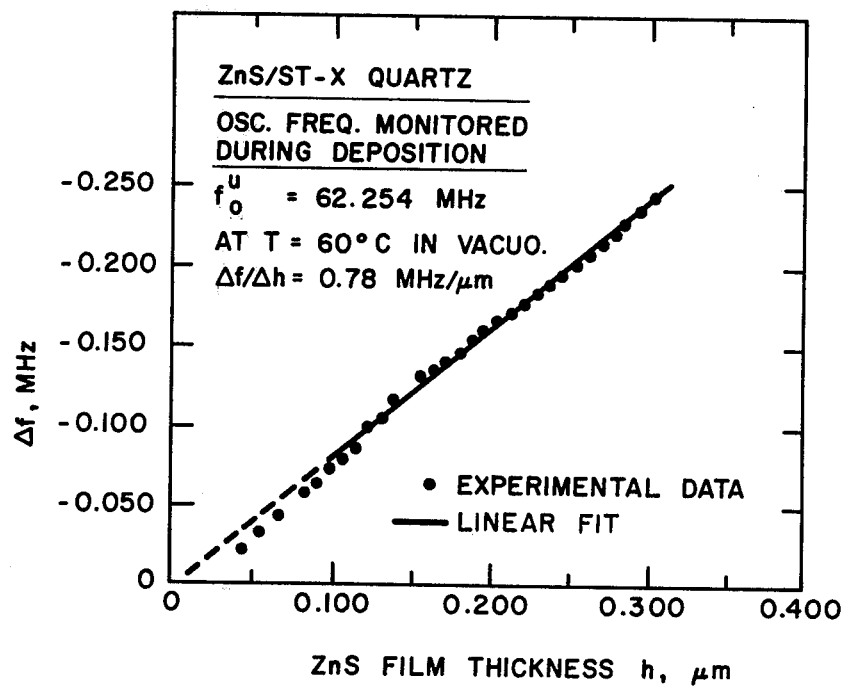
FIG. 2 is a graph of frequency shift vs. film thickness for a coated SAW device.

FIG. 2 shows the change in center frequency of a SAW device during deposition of a film of ZnS. It is apparant that the change in frequency is nearly linear with increase in thickness over the range observed. It is therefore possible to predict the change in frequency produced by a change in film thickness, though sample-to-sample variations appear to limit the precision of advance estimates of the frequency shift to be expected from a film of a given material and thickness.

Figure 3:
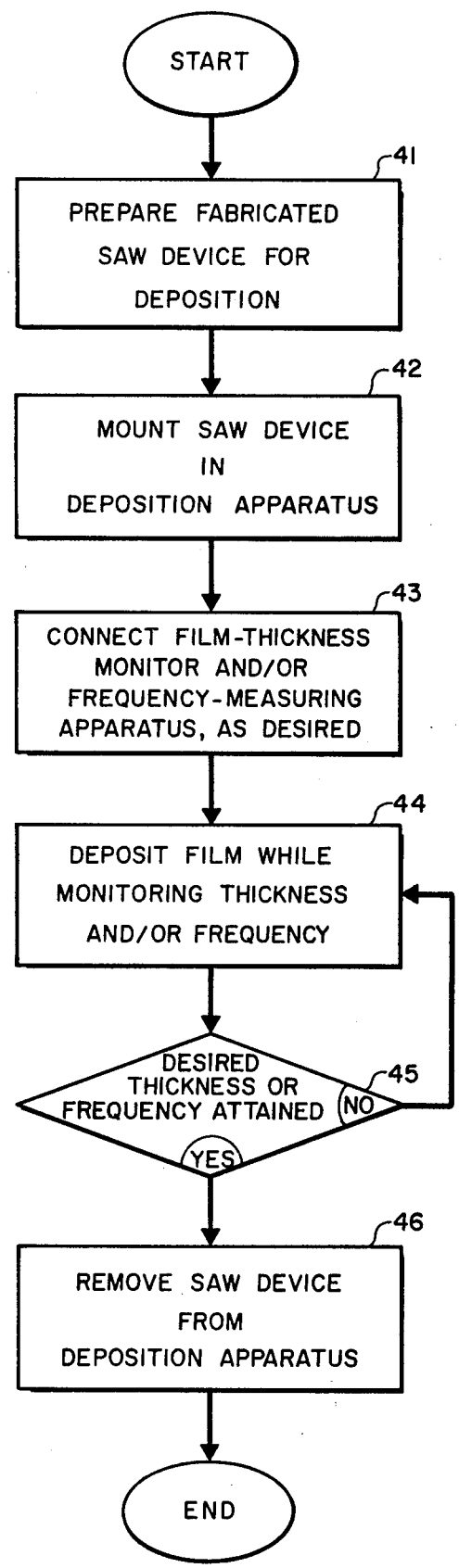
FIG. 3 is a flow chart showing the method of fabrication according to the invention.

FIG. 3, a flow chart, illustrates the method of tuning center frequency. First, the SAW device, (already fabricated by prior art methods), is prepared, 41, for thin film deposition, according to prior art.

The center frequency of an uncoated device is determined primarly by the configuration and spacing of the electrode fingers 12 and by the propagation characteristics of surface acoustic waves on the region of substrate 11 covered by electrodes 12. The choice of electrode material and thickness exert a minor influence on the center frequency of the device due to a material dependent loading effect on substrate 11.

The prepared SAW device is then mounted, 42, in a deposition apparatus of conventional design. Test equipment of conventional design is connected, 43, to the SAW device. Film 13 is deposited while the center frequency of the SAW device is monitored, 44, 45.

Thin film 13 of material is deposited on the SAW device including the transducers thereon to provide a contacting coating for the purpose of altering the center frequency. If film material 13 is such as to increase the elastic stiffness of substrate 11 the SAW velocity and hence the center frequency of the composite medium will be increased.

A coating material which reduces the elastic stiffness of substrate 11 (i.e., "loads the substrate") will cause the SAW velocity-and hence the center frequency-to decrease. When thin film 13 and substrate 11 materials have comparable SAW velocities, however, the situation is more complex, and additional elastic properties must be considered in order to predict whether thin film 13 will have a stiffening or loading effect on the substrate.

The elastic properties of thin film 13 frequently differ from the properties of the same material in bulk form. The thin-film properties, in such cases, are dependent on the details of the fabrication process. The bulk values of elastic properties are not compiled for many of the overlay materials which might be considered. This makes difficult even a rough advance estimate of the frequency alteration to be expected from some candidate materials without resorting to experimentation. Thin material 13 must possess sufficiently low electrical conductivity so that the electrical resistance between electrode structures, 12 will not be appreciably lowered; otherwise insertion loss of the SAW device would be increased to an unacceptable level. Hence a useful thin film material can be described as a "nonconducting material." The electrical properties of thin film material 13 particularly its conductivity, may differ from the values of the bulk material and may be highly process dependent.

A further consideration is that thin film material 13 should not significantly degrade other performance characteristics of the SAW device, such as durability, stability, reliability, bandpass shape, and temperature coefficient. Determination of the effect of these characteristics must be by experiment. Therefore the assessment of the suitability of candidate thin film material remains largely empirical. Approximations as to the effect on SAW velocity and insertion loss may be made for many materials on the basis of known bulk elastic and electrical properties.

The method of depositing 44, thin film material 13, may be any method which is compatible with thin film 13 and substrate material 11 involved. Conventional methods, such as vacuum evaporation or sputtering, are used, so as to avoid the use of expensive procedures, costly equipment or specialized training, thereby rendering utilization of this invention within the capability of most materials laboratories. The center frequency of the SAW device may be monitored 44, 45 during the deposition process in order to achieve a predetermined frequency. Center frequency can be monitored by setting up the device as an oscillator and monitoring together with conventional frequency measuring equipment. The film thickness should be uniform over the active area of the device, so that the entire device is retuned by the same amount; otherwise some tuning mismatch could result between the different transducers on the device, with a consequent increase in insertion loss.

There may exist specific applications, e.g., those employing SAW devices having more than one output transducer and/or more than one input transducer, where different amounts of tuning would be desired in different transducer regions of the device. In such cases the thin film materials 13 and/or its thickness could be made different over different transducer regions. When the desired center frequency is attained, 45, the process is concluded 45, 46.

The thickness of film 13 can also be monitered directly during deposition using conventional film measuring devices such as bulk wave quartz crystals whose frequency of oscillation changes due to mass loading in the deposition chamber next to the SAW device. The evaporation is concluded when the desired film thickness is obtained.

It will be apparent that the embodiment shown is only exemplary and the modifications in construction and arrangement may be made without departing from the scope of the invention as defined in the claims. In particular, it is apparent that the invention can be used to tune other types of SAW devices for which the center frequency depends on the SAW propagation velocity, such as SAW resonators. It is also apparent that the deposition of the film material may be applied or controlled selectively over different areas of the device by means of suitable masking and control procedures. For example, an application employing a SAW device having more than one output transducer and/or more than one input transducer may require tuning of the different transducers by different amounts. Furthermore, if desired, the film may be omitted from the regions outside or between the transducers, as the SAW velocity in these regions does not directly affect the passband center frequency.

What is claimed is:

1. A surface acoustic wave device comprising;
   a substrate, for supporting the propagation of surface acoustic waves;
   an input transducer formed on said substrate for producing surface acoustic waves;
   an output transducer formed on said substrate, for receiving surface acoustic waves; and
   an electrically nonconducting film deposited on and in contact with said substrate and transducers, said film having a predetermined thickness to obtain a desired center frequency of said surface acoustic waves.

2. A surface acoustic wave device as in claim 1 wherein said nonconducting film is aluminum oxide.

3. A surface acoustic wave device comprising:
   a substrate having a transducer region for supporting the propagation of surface acoustic waves;
   an input transducer formed on said substrate, for producing surface acoustic waves;
   an output transducer formed on said substrate for receiving surface acoustic waves; and
   an electrically nonconducting film deposited on and in contact with the transducer region of said substrate said film having a predetermined thickness to obtain a desired center frequency of said surface acoustic waves.

4. A surface acoustic wave device comprising;
   a substrate having an input and output transducer regions for supporting the propagation of surface acoustic waves, and an input transducer formed on said substrate for producing surface acoustic waves;
   multiple output transducers formed on said substrate for receiving surface acoustic waves; and
   an electrically nonconducting film of predetermined thickness deposited over one output transducer region of said substrate for adjusting the center frequency of that output transducer;
   a second electrically nonconducting film of adjustable thickness deposited over a second output transducer region for adjusting the center frequency of the second output transducer.

5. A surface acoustic wave device comprising:
   a substrate having input and output transducer regions for supporting the propagation of surface acoustic waves;
   multiple input transducers formed on said substrate for launching surface acoustic waves;
   an output transducer formed on said substrate for receiving surface acoustic waves;
   an electrically nonconducting film deposited on and in contact with one input region of said substrate for adjusting the center frequency of that input transducers; and
   a second electrically nonconducting film deposited on and in contact with a second input region of said substrate for adjusting the center frequency of the second input transducer.

6. A surface acoustic wave device comprising:
   a substrate, for supporting the propagation of surface acoustic waves;
   an input transducer formed on said substrate for producing surface acoustic waves;
   an output transducer formed on said substrate, for receiving surface acoustic waves; and
   an electrically nonconducting cadmium sulfide film deposited on and in contact with said substrate and transducers, for adjusting the center frequency thereof.

7. A surface acoustic wave device comprising:
   a substrate, for supporting the propagation of surface acoustic waves;
   an input transducer formed on said substrate for producing surface acoustic waves;
   an output transducer formed on said substrate, for receiving surface acoustic waves; and an electrically nonconducting zinc sulfide film deposited on and in contact with said substrate and transducers, for adjusting the center frequency thereof.

8. A surface acoustic wave device comprising:

a substrate, for supporting the propagation of surface acoustic waves;

an input transducer formed on said substrate for producing surface acoustic waves;

an output transducer formed on said substrate, for receiving surface acoustic waves; and an electrically nonconducting silicon dioxide film deposited on and in contact with said substrate and transducers, for adjusting the center frequency thereof.

* * * * *